United States Patent
Varadarajan et al.

(10) Patent No.: US 9,371,579 B2
(45) Date of Patent: Jun. 21, 2016

(54) GROUND STATE HYDROGEN RADICAL SOURCES FOR CHEMICAL VAPOR DEPOSITION OF SILICON-CARBON-CONTAINING FILMS

(71) Applicant: Lam Research Corporation, Fremont, CA (US)

(72) Inventors: Bhadri N. Varadarajan, Beaverton, OR (US); Bo Gong, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 225 days.

(21) Appl. No.: 14/062,648

(22) Filed: Oct. 24, 2013

(65) Prior Publication Data

US 2015/0118394 A1  Apr. 30, 2015

(51) Int. Cl.
 C23C 16/452 (2006.01)
 C23C 16/32 (2006.01)

(52) U.S. Cl.
 CPC ............. *C23C 16/325* (2013.01); *C23C 16/452* (2013.01)

(58) Field of Classification Search
 CPC ................ C23C 16/452; C23C 16/325; C23C 16/45574
 See application file for complete search history.

(56) References Cited

U.S. PATENT DOCUMENTS

| | | | |
|---|---|---|---|
| 4,952,658 A * | 8/1990 | Kalchauer | C04B 35/571 525/474 |
| 5,447,816 A * | 9/1995 | Kodama | C23C 16/325 427/575 |
| 5,807,615 A | 9/1998 | Sindzingre et al. | |
| 6,045,877 A | 4/2000 | Gleason et al. | |
| 6,159,871 A | 12/2000 | Loboda et al. | |
| 6,262,445 B1 | 7/2001 | Swanson et al. | |
| 6,352,945 B1 | 3/2002 | Matsuki | |
| 6,383,955 B1 | 5/2002 | Matsuki | |
| 6,395,150 B1 | 5/2002 | Van Cleemput et al. | |
| 6,432,846 B1 | 8/2002 | Matsuki | |
| 6,764,958 B1 | 7/2004 | Nemani et al. | |
| 6,790,788 B2 | 9/2004 | Li et al. | |
| 6,846,391 B1 | 1/2005 | Papasouliotis et al. | |

(Continued)

FOREIGN PATENT DOCUMENTS

TW  200903635 A  1/2009
TW  201214563 A  4/2012

OTHER PUBLICATIONS

Blaszczyk-Lezak, Iwona, et al., "Silicon Carbonitride Films Produced by Remote Hydrogen Microwave Plasma CVD Using a (Dimethylamino)dimethylsilane Precursor". Chemical Vapor Deposition, 2005, 11, No. 1, pp. 44-52.*

(Continued)

*Primary Examiner* — Bret Chen
(74) *Attorney, Agent, or Firm* — Weaver Austin Villeneuve & Sampson LLP

(57) ABSTRACT

A thin layer of a silicon-carbon-containing film is deposited on a substrate by generating hydrogen radicals from hydrogen gas supplied to a radicals generation chamber, supplying the hydrogen radicals to a substrate processing chamber separate from the substrate processing chamber via a multiport gas distributor, and reacting the hydrogen radicals therein with an organosilicon reactant introduced into the substrate processing chamber concurrently. The hydrogen radicals are allowed to relax into a ground state in a radicals relaxation zone within the substrate processing chamber before reacting with the organosilicon reactant.

20 Claims, 2 Drawing Sheets

(56) References Cited

U.S. PATENT DOCUMENTS

| | | | |
|---|---|---|---|
| 6,875,687 B1 | 4/2005 | Weidman et al. | |
| 6,881,683 B2 | 4/2005 | Matsuki et al. | |
| 6,890,850 B2 | 5/2005 | Lee et al. | |
| 6,919,270 B2 | 7/2005 | Satoh et al. | |
| 6,935,553 B2 | 8/2005 | Suga et al. | |
| 6,949,450 B2 | 9/2005 | Chiang et al. | |
| 6,991,959 B2 | 1/2006 | Goundar et al. | |
| 7,163,896 B1 | 1/2007 | Zhu et al. | |
| 7,622,400 B1 | 11/2009 | Fox et al. | |
| 7,662,355 B2 | 2/2010 | Kamisako et al. | |
| 7,709,063 B2 | 5/2010 | Yuda et al. | |
| 7,736,728 B2 | 6/2010 | Loboda et al. | |
| 8,021,992 B2 | 9/2011 | Liou et al. | |
| 8,053,372 B1 | 11/2011 | Greer et al. | |
| 8,168,268 B2 | 5/2012 | Ovshinsky | |
| 8,178,168 B2 | 5/2012 | O'Neill et al. | |
| 8,178,443 B2 | 5/2012 | Rangarajan et al. | |
| 9,234,276 B2 | 1/2016 | Varadarajan | |
| 2002/0039625 A1 | 4/2002 | Powell et al. | |
| 2002/0106891 A1 | 8/2002 | Kim et al. | |
| 2003/0089992 A1 | 5/2003 | Rathi et al. | |
| 2003/0154141 A1 | 8/2003 | Capazario et al. | |
| 2003/0194496 A1 | 10/2003 | Xu et al. | |
| 2004/0067308 A1 | 4/2004 | Zheng et al. | |
| 2004/0084680 A1 | 5/2004 | Ruelke et al. | |
| 2004/0089924 A1 | 5/2004 | Yuasa et al. | |
| 2004/0115876 A1 | 6/2004 | Goundar et al. | |
| 2004/0194706 A1* | 10/2004 | Wang | C23C 16/345 118/722 |
| 2005/0255714 A1* | 11/2005 | Iyer | H01L 21/3185 438/793 |
| 2005/0287811 A1* | 12/2005 | Inukai | H01L 21/31144 438/700 |
| 2006/0040507 A1 | 2/2006 | Mak et al. | |
| 2006/0110931 A1 | 5/2006 | Fukazawa et al. | |
| 2007/0004204 A1 | 1/2007 | Fukazawa et al. | |
| 2007/0281497 A1 | 12/2007 | Liu et al. | |
| 2008/0064173 A1 | 3/2008 | Hung | |
| 2008/0217746 A1 | 9/2008 | Morita et al. | |
| 2009/0082240 A1 | 3/2009 | Nukui et al. | |
| 2009/0218699 A1 | 9/2009 | Torres et al. | |
| 2009/0258487 A1* | 10/2009 | Lin | H01L 21/76825 438/618 |
| 2009/0264277 A1 | 10/2009 | Raj et al. | |
| 2010/0081293 A1 | 4/2010 | Mallick et al. | |
| 2010/0207274 A1 | 8/2010 | Hayashi et al. | |
| 2011/0027957 A1 | 2/2011 | Berry | |
| 2011/0045676 A1 | 2/2011 | Park et al. | |
| 2011/0114994 A1 | 5/2011 | Mandlik et al. | |
| 2011/0135557 A1 | 6/2011 | Rangarajan et al. | |
| 2011/0236594 A1 | 9/2011 | Haverkamp et al. | |
| 2012/0009802 A1 | 1/2012 | LaVoie et al. | |
| 2012/0077349 A1 | 3/2012 | Li et al. | |
| 2012/0142172 A1 | 6/2012 | Fox et al. | |
| 2013/0075455 A1 | 3/2013 | Shimizu | |
| 2013/0084711 A1 | 4/2013 | Liang et al. | |
| 2013/0129940 A1 | 5/2013 | Xiao et al. | |
| 2013/0242493 A1 | 9/2013 | Shenoy et al. | |
| 2013/0330935 A1 | 12/2013 | Varadarajan | |
| 2014/0356549 A1 | 12/2014 | Varadarajan | |
| 2015/0303056 A1 | 10/2015 | Varadarajan et al. | |

OTHER PUBLICATIONS

Hatanaka, Y., et al., "Experiments and analyses of SiC thin film deposition from organo-silicon by a remote plasma method". Thin Solid Films 368 (2000) 287-291.*

Huran, J., et al., "RBS study of amorphous silicon carbide films deposited by PECVD". Czechoslovak Journal of Physics, vol. 54 (2004), Suppl. C, C1006-C1010.*

Xu, Ying-Yu, et al., "Preparation of SiC Thin Film Using Organosilicon by Remote Plasma CVD Method". Mat. Res. Soc. Symp. Proc. vol. 544, 1999, pp. 185-189.*

Y. Benilan, M.-C. Gazeau, E.-T. ES-Sebbar, A. Jolly, E. Arzoumanian, N. Fray and H. Cottin, "Optimization of microwave Hydrogen plasma discharges to mimic Layman α(121.6 nm) solar irradiations." EPSC-DPS2011-1317, EPSC-DPJ Joint Metting 2011, EPSC Abstracts, Oct. 4, 2011, vol. 6.

A.C. Fozza, M. Moisan and M.R. Wertheimer, "Vacuum ultraviolet to visible emission from hydrogen plasma: Effect of excitation frequency," Journal of Applied Physics, Jul. 2000, vol. 88, No. 1, pp. 20-33.

Andreas Hollander and Michael R. Wertheimer, "Vacuum ultraviolet emission from microwave plasmas of hydrogen and its mixtures with helium and oxygen," J. Vac. Sci. Technol. A, May 1994, vol. 12, No. 3, pp. 879-882.

A.M. Wrobel, A. Walkiewicz-Pietrzykowska and I. Blaszczyk-Lezak, "Reactivity of organosilicon precursors in remote hydrogen microwave plasma chemical vapor deposition of silicon carbide and silicon carbonitride thin-film coatings," Applied Organic Chemistry, Dec. 17, 2009, vol. 24, pp. 201-207.

Varadarajan, Bhadri, U.S. Appl. No. 14/961,637, filed Dec. 7, 2015 entitled "Method to Obtain SiC Class of Films of Desired Composition and Film Properties."

Tan et al., U.S. Appl. No. 14/692,627, filed Apr. 21, 2015 entitled "Gap Fill Using Carbon-Based Films."

U.S. Office Action dated Dec. 19, 2014 issued in U.S. Appl. No. 13/907,699.

U.S. Final Office Action dated May 14, 2015 issued in U.S. Appl. No. 13/907,699.

U.S. Advisory Action and Examiner Initiated Interview Summary dated Aug. 12, 2015 issued in U.S. Appl. No. 13/907,699.

U.S. Notice of Allowance dated Sep. 10, 2015 issued in U.S. Appl. No. 13/907,699.

U.S. Office Action dated Nov. 2, 2015 issued in U.S. Appl. No. 14/616,435.

US Office Action dated Feb. 7, 2014 issued in U.S. Appl. No. 13/494,836.

US Final Office Action dated Aug. 21, 2014 issued in U.S. Appl. No. 13/494,836.

US Office Action dated May 5, 2015 issued in U.S. Appl. No. 13/494,836.

US Final Office Action dated Nov. 16, 2015 issued in U.S. Appl. No. 13/494,836.

Taiwan Office Action dated Dec. 22, 2015 issued in Application No. TW 102120742.

"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.

"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.

Fozza et al., (Jan./Feb. 1998) "Vacuum ultraviolet to visible emission of some pure gases and their mixtures used for plasma processing," *J. Vac. Sci. Technol. A, American Vacuum Society*, 16(1):72-77.

Grubbs et al., (May/Jun. 2006) "Attenuation of hydrogen radicals traveling under flowing gas conditions through tubes of different materials," *J. Vac. Sci. Technol. A*, 24(3):486-496.

Jones et al., (Nov. 30, 2001) "Silicon Containing Polymers: The Science and Technology of Their Synthesis and Applications." *Springer*, p. 705.

Maeda et al., (Sep. 1989), "A Low-Permittivity Interconnection Using an SiBN Interlayer," *IEEE Transactions on Electron Devices* 36(9).

"Radical (chemistry)" From Wikipedia, the free encyclopedia, [downloaded at http://en.wikipedia.org/wiki/Radical_(chemistry) on Sep. 23, 2015), 11 pages.

Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.

Wrobel et al. (2001) "Oligomerization and Polymerization Steps in Remote Plasma Chemical Vapor Deposition of Silicon-Carbon and Silica Films from Organosilicon Sources,"*Chem. Mater*, 13(5):1884-1895.

Wu et al. (Oct. 17-19, 2006), "Ultra Low k Dielectrics Prepared by PECVD Using a Single-Precursor and Treated by UV Assisted Thermal Processing,"*Advanced Metallization Conference (AMC)* 2006, pp. 1-6, San Diego, CA.

* cited by examiner

GROUND STATE HYDROGEN RADICAL SOURCES FOR CHEMICAL VAPOR DEPOSITION OF SILICON-CARBON-CONTAINING FILMS

BACKGROUND

Silicon carbide films are often used as barrier layers in semiconductor substrate processing operations. As such, the silicon carbide film often must have a high density (e.g., more than about 2 g/cc), must be hermetic, and must have a low porosity to prevent diffusion of undesirable material through the barrier layer (e.g., metal atoms or air) or to prevent undesirable etching of the barrier layer.

Some have suggested that generating a remote hydrogen plasma may improve silicon carbide film properties. However, wall collisions and other quenching events are expected to reduce the yield of active species generated by a remote plasma. In turn, the film deposition rate for a remote hydrogen plasma process is expected to be unacceptably low. Because silicon carbide film density is believed to vary inversely with process pressure, increases in process pressure intended to increase deposition rate may adversely lower film density, leading to unacceptable barrier performance properties.

DETAILED DESCRIPTION OF PREFERRED EMBODIMENTS

Thin silicon-carbon-containing films (e.g., silicon carbides ($SiC_x$), silicon-carbon-nitrides ($SiN_xC_y$), silicon-carbon-oxides ($SiC_xO_y$), and silicon-carbon-oxynitrides ($SiC_xO_yN_z$)) are frequently used as barrier materials in integrated semiconductor manufacturing processes. For example, silicon-carbon-containing films may be employed as metal diffusion barriers, etch stop layers, hard mask layers, or gate spacers for source and drain implants, as encapsulation barriers for magnetoresistive random-access memory (MRAM) or resistive random-access memory (RRAM), or as hermetic diffusion barriers at air gaps. These films are formed by plasma-enhanced chemical vapor deposition (PECVD) from a reaction between an organosilicon reactant or precursor and a co-reactant. Plasma activation of reacting species may lower the activation temperature of the deposition reaction and make otherwise unstable reaction pathways accessible. However, PECVD processes may unselectively cleave precursor bonds, potentially making the electrical and physical properties of the film difficult to predict.

Figure 1:
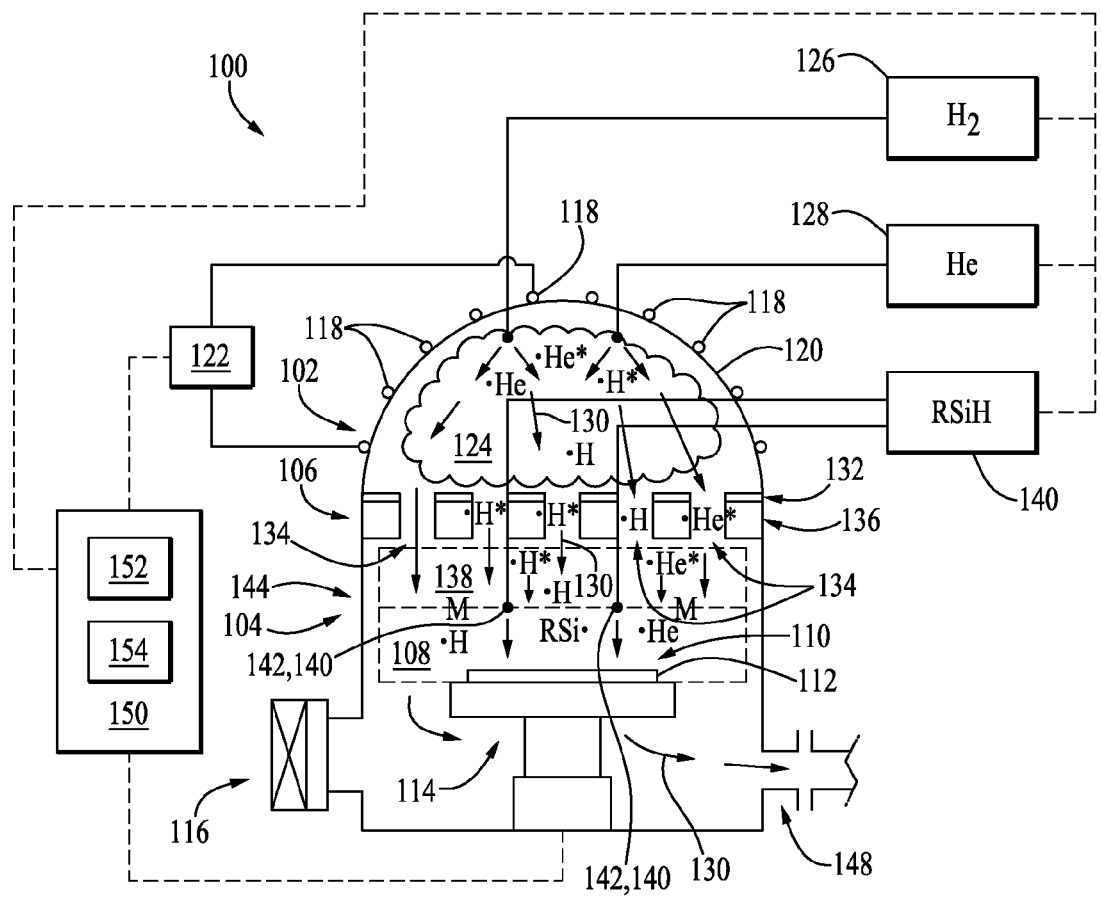
FIG. 1 is a schematic cross-section of a substrate processing module according to a first embodiment.

FIG. 1 is a schematic view of an embodiment of a substrate processing module 100. Generally, substrate processing module 100 includes a radicals generation chamber 102 separated from a substrate processing chamber 104, but fluidly coupled therewith via a multiport gas distributor 106. Hydrogen radicals are generated in a radicals generation chamber 102 and supplied to a chemical vapor deposition zone 108 within substrate processing chamber 104. An organosilicon reactant supplied concurrently to chemical vapor deposition zone 108 reacts with the hydrogen radicals to deposit a thin film of a silicon-carbon-containing film 110 on a surface of substrate 112 (e.g., a semiconductor device substrate or wafer) facing an interior of substrate processing chamber 104.

Substrate 112 is supported on a pedestal 114. Pedestal 114 may move within substrate processing chamber 104 to position substrate 112 within chemical vapor deposition zone 108. In the embodiment shown in FIG. 1, pedestal 114 is shown having elevated substrate 112 from a load position by substrate entry port 116 to a deposition position within chemical vapor deposition zone 108. Pedestal 114 may also adjust the temperature of substrate 112 in some embodiments, potentially providing some selective control over thermally activated surface reactions on substrate 112.

FIG. 1 shows a coil 118 arranged around a radicals generation chamber outer wall 120 (e.g., a quartz dome) of radicals generation chamber 102. Coil 118 is electrically coupled with a plasma generator controller 122, both of which are used to form and sustain plasma region 124 via inductively coupled plasma generation within radicals generation chamber 102. In one non-limiting example, plasma generator controller 122 may supply power in a range of between about 1 and 6 Kilowatts (kW) during plasma generation with an inductively coupled plasma. In some embodiments, electrodes or antennae for parallel plate or capacitively coupled plasma generation may be used to generate a continuous supply of excited hydrogen radicals via plasma excitation. Regardless of the mechanism used to strike and sustain plasma region 124 within radicals generation chamber 102, hydrogen radicals are continuously generated using plasma excitation during film deposition. In some embodiments, hydrogen radicals are generated under approximately steady-state conditions during steady-state film deposition, though transients may occur at the beginning and end of film deposition and/or at the beginning and end of an interval when the organosilicon reactant is concurrently supplied to substrate processing chamber 104.

Given stable plasma conditions, a supply of hydrogen radicals is continuously generated within plasma region 124 while hydrogen gas is being supplied to radicals generation chamber 102. Once formed, excited hydrogen radicals have an energetic lifetime of about $1\times10^{-3}$ seconds or less. If not re-excited or re-supplied with energy, the excited hydrogen radicals lose their energy, or relax, by emitting light or heat or by quenching through interaction with another molecule or surface. For example, excited atomic hydrogen radicals (.H*) may relax to form relaxed atomic hydrogen radicals (.H), that is, ground state atomic hydrogen.

Depending on the electron temperature of the plasma formed in plasma region 124, the excited hydrogen radicals are likely to include more excited molecular hydrogen radicals (.$H_2$*) than excited atomic hydrogen radicals, as less energy is needed to form .$H_2$* than is needed to dissociate hydrogen gas to form .H*. Excited molecular hydrogen radicals may be unselective, when compared to atomic hydrogen radicals, at breaking the bonds within the organosilicon reactant, potentially forming low-density films.

In contrast, diluted hydrogen gas mixtures (i.e., hydrogen gas diluted with one or more additional gases) may be more likely to form excited atomic hydrogen radicals. For example, an excited helium (He) radical (.He*) or a ground state helium radical (.He) may break up hydrogen gas to form atomic hydrogen radicals. In some embodiments, one or more additional gases may be supplied to radicals generation chamber 102 along with hydrogen gas during radicals generation.

Non-limiting examples of additional gases include helium, neon (Ne), argon (Ar), krypton (Kr), xenon (Xe), and nitrogen ($N_2$).

Supplying one or more additional gases may support or stabilize steady-state plasma conditions within radicals generation chamber 102 or aid in transient plasma ignition or extinction processes (i.e., striking or quenching the plasma before and after processing substrate 112). In some embodiments, diluting hydrogen gas with helium, as described in more detail below, may permit higher total pressures within radicals generation chamber 102 without concomitant plasma breakdown. Put another way, a dilute hydrogen gas mixture of hydrogen in helium may permit higher total gas pressure without increasing plasma power to radicals generation chamber 102. In some process settings, this may speed film deposition without decreasing film density.

The embodiment shown in FIG. 1 depicts a hydrogen gas source 126 and a helium gas source 128 fluidly coupled to radicals generation chamber 102 to supply hydrogen and helium gases during process. In some embodiments, hydrogen or helium gas, or a mixture thereof, may be continuously supplied, typically at a steady-state flow rate, in a flow rate range of between about 2 and 40 standard liters per minute (slm); or preferably, in a flow rate range of between about 5 and 25 slm; or more preferably in a flow rate range of between about 10 and 20 slm. In some embodiments, a mixture of hydrogen and helium within radicals generation chamber 102 may include a steady-state concentration of between about 1 and 99 volume percent (vol %) hydrogen gas in helium. Preferably, a mixture of hydrogen and helium may include a steady-state concentration of between about 1 and 17 vol % hydrogen gas in helium, or more preferably, between about 1 and 10 vol % hydrogen gas in helium, or even more preferably, between about 2 and 5 vol % hydrogen gas in helium. While the embodiment shown in FIG. 1 depicts separate inlets for introducing hydrogen and helium gases, in some embodiments a mixture of hydrogen and one or more additional gases may be introduced directly into radicals generation chamber 102. That is, a pre-mixed dilute hydrogen mixture may be supplied to radicals generation chamber 102.

Gases, including excited hydrogen and helium radicals and relaxed gases, flow out of radicals generation chamber 102 into substrate processing chamber 104 along a gas flow path 130 via multiport gas distributor 106. Gases within multiport gas distributor 106 are not subject to continued plasma excitation therein. In some embodiments, multiport gas distributor 106 may act as an opposite pole (e.g., a ground electrode) to terminate plasma region 124, so that it is contained entirely within radicals generation chamber 102.

In some embodiments, multiport gas distributor 106 may include an ion filter or a photon filter (e.g., for filtering one or more wavelengths of light, such as ultraviolet (UV) light) or both of them before introducing the excited hydrogen radicals into the radicals relaxation zone. Filtering ions and photons may prevent substrate damage (e.g., via ion bombardment), undesirable re-excitation of molecules (e.g., via UV excitation), and/or non-selective breakdown or decomposition of the organosilicon reactant within substrate processing chamber 104. In FIG. 1, multiport gas distributor 106 is shown equipped with a filter 132.

Multiport gas distributor 106 has a grouping of mutually spaced apart gas ports 134 to diffuse and spread the flow of gases into substrate processing chamber 104. In the embodiment shown in FIG. 1, grouping is shown as an array of regularly spaced apart channels or through-holes passing through a barrier plate 136 separating radicals generation chamber 102 from substrate processing chamber 104. Gas ports 134 may pass straight through multiport gas distributor 106, as shown in FIG. 1, or may include one or more bends. In some embodiments, multiport gas distributor 106 may have 300 or more gas ports 134 to smoothly disperse and diffuse gases exiting radicals generation chamber 102 into substrate processing chamber 104.

At some process conditions, such as at radical generation chamber pressures of less than about 1-1.5 Torr, the principal mode of radical extinction may result from collisions between radicals and wall surfaces. Typically, remote plasma generators are far removed from reaction vessels, often having plasma sources that are fluidly coupled to reaction vessels via slender tubes that may be 0.3 meter long or more. Consequently, radical extinction and recombination, e.g., via wall collision events, may reduce active species concentration dramatically. In contrast, in some embodiments dimensions for gas ports 134 may be configured in view of the mean free path or gas flow residence time under typical processing conditions to aid the free passage of radicals into substrate processing chamber 104. In some embodiments, openings for gas ports 134 in multiport gas distributor 106 may occupy in a range of about 5-20% of the exposed surface area of multiport gas distributor 106. That is, about 5-20% of multiport gas distributor 106 may be open space through which gases may flow from radicals generation chamber 102 into substrate processing chamber 104. In some embodiments, gas ports 134 may have an axial length to diameter ratio of between about 3:1 and 10:1, and preferably between about 6:1 and 8:1. Gas port aspect ratios in this range may reduce wall-collision frequency for all hydrogen radicals passing through gas ports 134 while providing sufficient time for a majority of the excited state hydrogen radicals to relax to ground state hydrogen radicals. In some embodiments, gas ports 134 may be sized so that the residence time of gases passing through multiport gas distributor 106 is greater than the typical energetic relaxation time of an excited hydrogen radical. For example, gas ports 134 may be sized so that the residence time of excited hydrogen radicals passing through multiport gas distributor 106 is greater than at least about $1 \times 10^{-3}$ seconds.

While the overall concentration of active species may be greater if some excited radicals survive the passage through multiport gas distributor 106 and into substrate processing chamber 104, the contact between excited radicals and the organosilicon reactant within substrate processing chamber 104 may lead to undesirable processing. For example, gas phase reactions between excited radicals and the organosilicon reactant may cause non-selective decomposition of the organosilicon reactant, potentially altering the composition or other physical or electrical characteristics (e.g., film density, film sheet resistance, film hermeticity, and film etch resistance, among others) of the film. Other gas phase interactions between excited radicals and the organosilicon reactant may decorate substrate 112 with small particles, potentially leading to patterning defects during subsequent substrate process events. Accordingly, process gases exiting gas ports 134 follow gas flow path 130 into a radicals relaxation zone 138 contained entirely within the interior of substrate processing chamber 104 upstream of chemical vapor deposition zone 108. Substantially all of the excited hydrogen radicals flowing into radicals relaxation zone 138 transition into relaxed hydrogen radicals. Put another way, almost all of the excited hydrogen radicals entering radicals relaxation zone 138, within an acceptable tolerance, become de-excited, or transition into a relaxed or ground state, prior to exiting radicals relaxation zone 138. An acceptable tolerance within the scope of this disclosure may encompass a concentration of excited hydrogen radicals resulting from a residence time of hydrogen gas within radicals relaxation zone 138 of at least $1\times10^{-3}$ seconds, and preferably of between $1\times10^{-3}$ seconds and $1\times10^{-1}$ seconds. Because residence time may be difficult to measure, the residence time of hydrogen gas within radicals relaxation zone 138 in practice is determined by any commercial computational fluid dynamics software using a model of the actual system with a suitable mesh size (e.g., a finite element analysis simulator and solver like that sold under the trade name COMSOL MULTIPHYSICS® by Comsol, Inc. of Burlington, Mass.).

In some embodiments, process conditions (e.g., pressure and gas flow rates), and/or the geometry of radicals relaxation zone 138 may be set so that the residence time of gas flowing through radicals relaxation zone 138 may be at least about $1\times10^{-3}$ seconds. In some embodiments, process conditions or the geometry of radicals relaxation zone 138 may be set so that the residence time of hydrogen gas flowing through radicals relaxation zone 138 is less than a relaxation time (e.g., a time determined by the mean free path and the mean molecular velocity) resulting from radical-quenching intermolecular collisions within radicals relaxation zone 138, so that ground state hydrogen radicals are still present in gases flowing out of radicals relaxation zone 138 upstream, in flow path 130, of chemical vapor deposition zone 108.

Concurrent with the delivery of hydrogen radicals to radicals relaxation zone 138, a flow of organosilicon reactant from organosilicon reactant source 140 is introduced into chemical vapor deposition zone 108. In some embodiments, the organosilicon reactant may be supplied in a flow rate range of between about 0.5 and 25 standard cubic centimeters per minute (sccm). Preferably, the organosilicon reactant may be supplied in a flow rate range of between about 1 and 10 sccm, and more preferably, at a rate of between about 1 and 5 sccm.

The organosilicon reactant is introduced via an organosilicon reactant distributor 142 located at an organosilicon reactant injection location 144 downstream in flow path 130 from radicals relaxation zone 138. Radicals relaxation zone 138 is entirely contained in a space formed between multiport gas distributor 106 and organosilicon reactant distributor 142. In the embodiment shown in FIG. 1, organosilicon reactant distributor 142 includes mutually spaced apart reactant openings positioned so that the flow of the organosilicon reactant is introduced to gas flow path 130 in a direction parallel with flow of the gas mixture through substrate processing chamber 104.

Figure 2:
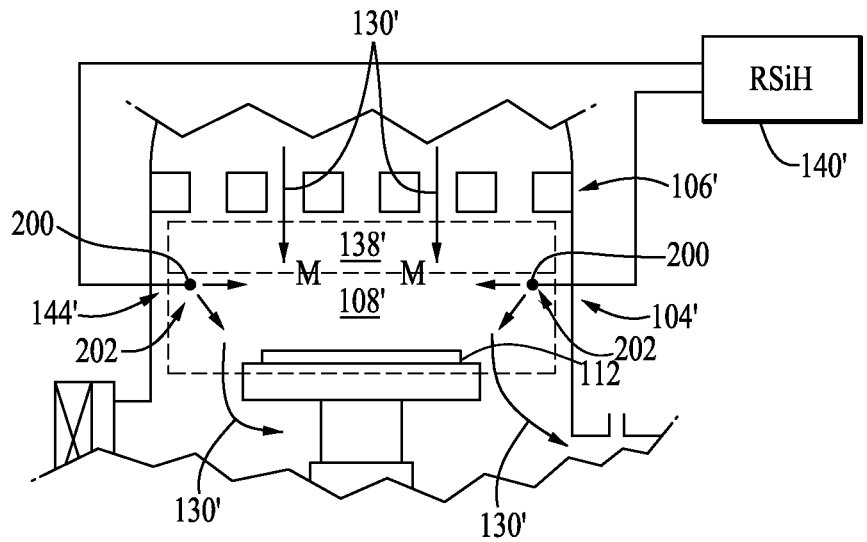
FIG. 2 is a schematic cross-section of a portion of a substrate processing module according to a second embodiment.

FIG. 2 shows another embodiment of an organosilicon reactant distributor 200. In FIG. 2, the reference numbers having the same digits as FIG. 1, as annotated with an apostrophe, identify analogous structures. For example, reference number 138' in FIG. 2 identifies a radicals relaxation zone analogous to radicals relaxation zone 138 in FIG. 1. In the embodiment of FIG. 2, mutually spaced apart reactant openings 202 are arranged at the walls of substrate processing chamber 104' so that the flow of the organosilicon reactant is introduced to gas flow path 130' in a direction intersecting the flow of the gas mixture through substrate processing chamber 104' at a location downstream of the radicals relaxation zone 138'.

In the embodiment shown in FIG. 2, chemical vapor deposition zone 108' is formed within the interior of substrate processing chamber 104' between multiport gas distributor 106' and substrate 112, and is spaced apart from multiport gas distributor 106' by radicals relaxation zone 138'. In turn, substantially all of the flow of the organosilicon reactant is prevented from mixing with the excited gases adjacent to multiport gas distributor 106', where the concentration of excited hydrogen radicals may be higher than elsewhere within substrate processing chamber 104'.

In some embodiments, organosilicon reactant injection location 144, 144' may be adjacent to a region or location in flow path 130, 130' where relaxed hydrogen radicals co-mingle or mix with the organosilicon reactant. In FIGS. 1 and 2, a mixing location "M" marks a region where relaxed hydrogen radicals mix with organosilicon reactant. It is expected that, through dilution or reaction or both, the concentration of organosilicon reactant at the mixing location will exceed the concentration of organosilicon reactant at locations upstream of the mixing location in flow path 130. It is also expected that the concentration of relaxed hydrogen radicals will exceed the concentration of organosilicon reactant at locations upstream of the mixing location in flow path 130. Thus, the mixing location represents a conceptual boundary between radicals relaxation zone 138 and the energetic relaxations occurring therein and chemical vapor deposition zone 108 and the reactive processes occurring therein. Of course, the shape and thickness of the boundary may vary according to the local fluid flow profile (e.g., plug flow, parabolic flow, or profiles therebetween) and local fluid diffusion profile. Because flow and diffusion profiles may be difficult to measure, one or both may be simulated in practice using any commercial computational fluid dynamics software using a model of the actual system.

In some embodiments, organosilicon reactant injection location 144 may be separated from multiport gas distributor 106 by a sufficient distance to prevent via back diffusion or back streaming of the organosilicon reactant along flow path 130. In some embodiments, organosilicon reactant injection location 144 may be separated from gas ports 134 in multiport gas distributor 106 by a distance along the direction of flow path 130 of between about 0.5 and 5 inches, preferably by a distance of between about 1.5 and 4.5 inches, and more preferably by a distance of between about 1.5 and 3 inches. In some embodiments, organosilicon reactant injection location 144 may be positioned relative to multiport gas distributor 106 so that a mass fraction of the organosilicon reactant present at a location adjacent to gas ports 134 is about 0.1 or less. Because local measurement of the organosilicon mass fraction may be difficult, any commercial computational fluid dynamics software using a model of the actual system with a suitable mesh size may be used to determine the mass fraction or concentration of the organosilicon reactant at the exit openings of gas ports 134. Preferably, organosilicon reactant injection location 144 may be separated from multiport gas distributor 106 so that a mass fraction of the organosilicon reactant is about 0.02 or less at the exit openings of gas ports 134, or more preferably, so that a mass fraction of the organosilicon reactant is about 0.015 or less at the exit openings of gas ports 134.

At least some of the relaxed hydrogen radicals flowing from radicals relaxation zone 138 into chemical vapor deposition zone 108 react therein with some of the organosilicon reactant flowing concurrently, causing silicon-carbon-containing film 110 to be deposited on substrate 112. Thus, chemical vapor deposition zone 108 represents a portion of substrate processing chamber 104 where relaxed hydrogen radicals and organosilicon reactant mix and react in the gas phase during CVD formation of silicon-carbon-containing film 110. In some embodiments, heat may be provided to substrate processing chamber 104 (e.g., by heating chemical vapor deposition zone 108 or pedestal 114) to adjust the film deposition rate at the surface of substrate 112. In some embodiments, the bulk temperature of substrate 112 may be maintained at a temperature of between about 200 degrees Celsius and about 400 degrees Celsius. In some embodiments, the bulk temperature may be maintained at a temperature of less than about 250 degrees Celsius.

Naturally, the composition of silicon-carbon-containing film 110 may vary according to the nature of the organosilicon reactant. In some embodiments, the organosilicon reactant may include at least one Si—H bond or at least one Si—Si bond, either of which may be susceptible to a bond scission reaction with a relaxed hydrogen radical.

An organosilicon reactant is selected and supplied to provide desired composition properties, and in some cases, physical or electronic properties, in silicon-carbon-containing film 110. Examples of organosilicon reactants include siloxanes, silanes, alkyl silanes, alkoxy silanes, and amino silanes, among others. For example, silicon-carbon-containing films (e.g., silicon carbides, silicon-carbon-oxides and silicon-carbon-oxynitrides) may be formed using silanes. Non-limiting examples of silanes include silane, disilane, trisilane, and higher silanes. Non-limiting examples of alkyl silanes include dimethylsilane, trimethylsilane, tetramethylsilane, triethylsilane, and pentamethyldisilamethane.

Silicon-carbon-containing films also including oxygen atoms (e.g., silicon-carbon-oxides and silicon-carbon-oxynitrides) may be formed using an organosilicon reactant that includes oxygen, such as siloxanes and alkoxy silanes. Non-limiting examples of siloxanes include cyclotetrasiloxanes (e.g., 2,4,6,8-tetramethylcyclotetrasiloxane; octamethylcyclotetrasiloxane; and heptamethylcyclotetrasiloxane); other cyclic siloxanes; siloxanes having three-dimensional or caged structures (i.e., where silicon atoms are bridged with one another via oxygen atoms, forming a three-dimensional structure or a polyhedron) such as silsequioxane; and linear siloxanes, such as disiloxanes (e.g., pentamethyldisiloxane, tetramethyldisiloxane, and hexamethyl trisiloxane). The structural configuration (that is, linear, cyclic, or caged) of the siloxane may affect film porosity properties. For example, cyclic siloxanes may form microporous films having pores sized according to the cyclic ring size, and caged siloxanes may form mesoporous films. Non-limiting examples of alkoxy silanes include methoxysilane, dimethoxysilane, trimethoxysilane, methyldimethoxysilane, diethoxymethylsilane, dimethylethoxysilane, and dimethylmethoxysilane.

Silicon-carbon-containing films also including nitrogen atoms (e.g., silicon-carbon-nitrides and silicon-carbon-oxynitrides) may be formed using an organosilicon reactant that includes nitrogen, such as amino silanes and silazanes. Non-limiting examples of amino silanes include 2,2-bis(dimethylamino)-4,4-dimethyl-2,4-disilapentane, 2,2,4-trimethyl-4-dimethylamino-3,4-disilapentane, dimethylaminodimethylsilane, bis(dimethylamino)methylsilane, and tris(dimethylamino)silane. 1,1,3,3-tetramethyldisilazane is a non-limiting example of a silazane.

Naturally, one or more organosilicon reactants may be selected according to the composition desired in silicon-carbon-containing film 110. For example, a silicon-carbon-oxide may be formed by supplying a mixture of a silane and a siloxane. In some embodiments, an organosilicon reactant may provide all of the heteroatoms for silicon-carbon-containing film 110. For example, dimethylaminomethylethoxysilane may provide oxygen and nitrogen atoms for a silicon-carbon-oxynitride film deposition process.

The process gases are removed from substrate processing chamber 104 via a gas outlet 148 configured to be fluidly coupled to a pump (not shown). Thus, excess organosilicon reactant, hydrogen gas, and any other diluent and displacement or purge gases may be removed from substrate processing chamber 104 by evacuation or displacement purging or both via gas outlet 148. In some embodiments, gas outlet 148 may be fluidly coupled with a pressure control device (e.g., a pressure control valve) configured to throttle gas flow out of substrate processing module 100 and thereby adjust the pressure therein.

The embodiment shown in FIG. 1 also depicts a substrate module controller 150 in operative communication (e.g., electrical or pneumatic communication) with substrate processing module 100. Substrate module controller 150 controls deposition and maintenance operations for substrate processing module 100.

In the embodiment shown in FIG. 1, substrate module controller 150 includes a processing subsystem 152 (e.g., a microprocessor) configured to execute instructions held in a data subsystem 154 (e.g., memory). For example, substrate processing recipes stored in data subsystem 154 may be executed by processing subsystem 152 to control operation of substrate processing module 100 during film deposition. As an example, the embodiment of substrate module controller 150 shown in FIG. 1 communicates with plasma generator controller 122 to control plasma region 124 during plasma ignition, operation, and extinction events. Substrate module controller 150 also communicates with pedestal 114 to provide pedestal elevation control and pedestal temperature control. In some embodiments, substrate module controller 150 may also control pressure within radicals generation chamber 102 and/or substrate processing chamber 104. In some embodiments, substrate module controller 150 may operate gas flow rate controllers regulating the flow of hydrogen gas source 126, helium gas source 128, and organosilicon reactant source 140 into substrate processing module 100.

Figure 3:
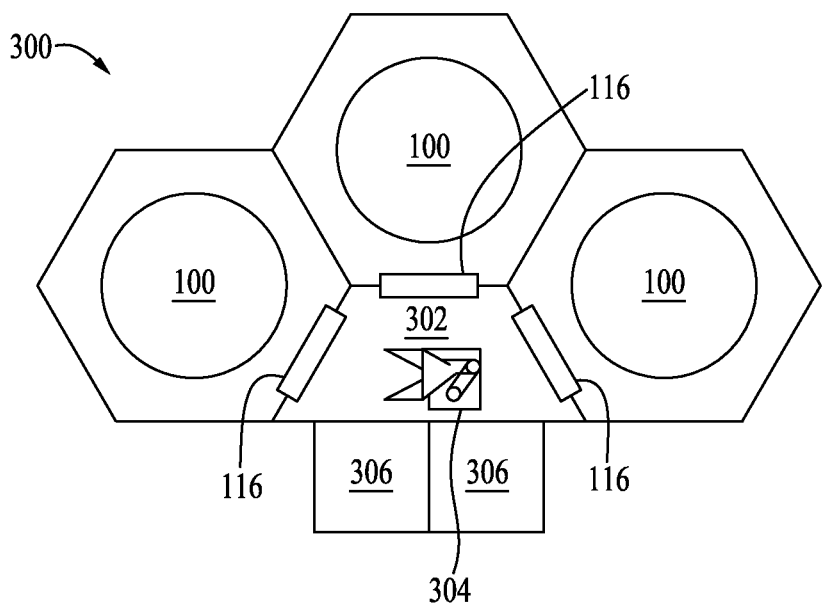
FIG. 3 is a schematic plan view of a substrate processing platform including four substrate processing modules arranged around a substrate transport module.

For ease of illustration, substrate processing module 100 is depicted and described in a standalone sense. In some embodiments, two or more substrate processing modules 100 may be coupled together to provide sequential or parallel processing of substrates. FIG. 3 schematically shows an example substrate processing platform 300 having several substrate processing modules 100 coupled together by a substrate transfer station 302. Substrate transfer station 302 includes a substrate handler 304 that moves substrates into and out of individual processing modules, between them, and into and out of substrate processing platform 300 via load ports 306.

It will be obvious to those having skill in the art that many changes may be made to the details of the above-described embodiments without departing from the underlying principles of the invention. The scope of the present invention should, therefore, be determined only by the following claims.

The invention claimed is:

1. A method for depositing a silicon-carbon-containing film on a substrate, the method comprising:
    providing a substrate in a processing chamber;
    introducing a flow of hydrogen gas into a plasma chamber that is separate from the processing chamber and fluidly coupled therewith via a gas distributor, the gas distributor having a plurality of through-holes;
    exciting at least a portion of the hydrogen gas within the plasma chamber to dissociate the hydrogen radicals and form excited hydrogen radicals;
    directing a flow of the excited hydrogen radicals through the gas distributor into a region adjacent to the gas distributor in an interior of the processing chamber; and
    directing a flow of an organosilicon reactant into a chemical vapor deposition zone, wherein the chemical vapor deposition zone is defined between the substrate and the region adjacent to the gas distributor, wherein substantially all of the excited hydrogen radicals transition into relaxed hydrogen radicals without recombining after flowing through the gas distributor and the region, at least some of the relaxed hydrogen radicals flowing from the region into the chemical vapor deposition zone concurrent with the flow of the organosilicon reactant and reacting therein with some of the organosilicon reactant, thereby depositing a silicon-carbon-containing film on the substrate.

2. The method of claim 1, in which the organosilicon reactant is directed via reactant openings into the chemical vapor deposition zone, and in which the region is entirely contained in a space defined between the gas distributor and the reactant openings.

3. The method of claim 2, in which the reactant openings are configured to preferentially direct the flow of the organosilicon reactant in a direction parallel with a flow path of the excited hydrogen radicals.

4. The method of claim 2, in which the reactant openings are configured to preferentially direct the flow of the organosilicon reactant in a direction intersecting with a flow path of the excited hydrogen radicals.

5. The method of claim 1, in which a size of the region is between about 0.5 and about 5 inches.

6. The method of claim 1, in which the plurality of through-holes in the gas distributor are arranged as an array of regularly spaced apart gas ports.

7. The method of claim 1, further comprising removing excess organosilicon reactant and hydrogen gas from the processing chamber by evacuation or displacement purging or both via a gas outlet.

8. The method of claim 1, in which a mean residence time of excited hydrogen radicals within the gas distributor is greater than about $1 \times 10^{-3}$ seconds.

9. The method of claim 1, in which a mean residence time of gas within the region is more than about $1 \times 10^{-3}$ seconds.

10. The method of claim 1, in which the through-holes in the gas distributor have an axial length to diameter ratio in a range of about 3:1 to 10:1.

11. The method of claim 1, in which introducing a flow of hydrogen gas includes introducing a gas mixture of hydrogen gas and helium gas, the gas mixture including between about 1 and about 17 volume percent hydrogen gas.

12. The method of claim 1, in which the organosilicon reactant is selected from the group consisting of siloxanes, silanes, alkyl silanes, alkoxy silanes, and amino silanes.

13. The method of claim 1, further comprising directing a gas flow path of the excited hydrogen radicals through an ion filter or a photon filter or both before directing the excited hydrogen radicals through the gas distributor and into the region.

14. The method of claim 1, in which the mass fraction of the organosilicon reactant in the region in a vicinity of the gas distributor is about 0.1 or less.

15. A method for depositing a silicon-carbon-containing film on a substrate, the method comprising:
supporting a substrate in a processing chamber;
introducing a flow of a gas mixture of dilute hydrogen gas in helium gas into a plasma chamber that is separate from the processing chamber and fluidly coupled therewith via a gas distributor, the gas distributor having a plurality of through-holes;
exciting at least a portion of the hydrogen gas within the plasma chamber to dissociate the hydrogen radicals and form excited hydrogen radicals in the gas mixture;
directing a flow of the excited hydrogen radicals in the gas mixture through the gas distributor into a region adjacent to the gas distributor in an interior of the processing chamber; and
directing a flow of an organosilicon reactant into a chemical vapor deposition zone, wherein the chemical vapor deposition zone is defined between the substrate and the region adjacent to the gas distributor, wherein substantially all of the excited hydrogen radicals transition into relaxed hydrogen radicals without recombining after flowing through the gas distributor and the region, at least some of the organosilicon reactant reacting with at least some relaxed hydrogen radicals flowing from the region concurrent with the flow of the organosilicon reactant, thereby depositing a silicon-carbon-containing film on the substrate.

16. The method of claim 15, in which introducing a flow of a gas mixture of dilute hydrogen gas in helium gas includes introducing a dilute hydrogen gas mixture including between about 1 and about 17 volume percent hydrogen gas in helium.

17. The method of claim 15, in which a mean residence time of excited hydrogen radicals within the gas distributor is greater than about $1 \times 10^{-3}$ seconds, and in which a mean residence time of gas within the region is more than about $1 \times 10^{-3}$ seconds.

18. The method of claim 15, in which the organosilicon reactant is directed via reactant openings into the chemical vapor deposition zone, and in which the region is entirely contained in a space defined between the gas distributor and the reactant openings.

19. The method of claim 18, in which the reactant openings are configured to preferentially direct the flow of the organosilicon reactant in a direction parallel with a flow path of the excited hydrogen radicals.

20. The method of claim 18, in which the reactant openings are configured to preferentially direct the flow of the organosilicon reactant in a direction intersecting with a flow path of the excited hydrogen radicals.

* * * * *